(12) United States Patent
Kumagai et al.

(10) Patent No.: US 6,452,892 B1
(45) Date of Patent: Sep. 17, 2002

(54) MAGNETIC TUNNEL DEVICE, METHOD OF MANUFACTURE THEREOF, AND MAGNETIC HEAD

(75) Inventors: Seiji Kumagai; Junichi Honda, both of Miyagi; Yoshito Ikeda, Tochigi, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/486,140

(22) PCT Filed: Jun. 22, 1999

(86) PCT No.: PCT/JP99/03327

§ 371 (c)(1),
(2), (4) Date: May 1, 2000

(87) PCT Pub. No.: WO99/67828

PCT Pub. Date: Dec. 29, 1999

(30) Foreign Application Priority Data

Jun. 22, 1998 (JP) ............................................. 10-175197

(51) Int. Cl.[7] ................................................. G11B 7/00
(52) U.S. Cl. ...................... 369/126; 369/44.11; 250/306
(58) Field of Search ............................... 369/47.1, 53.1, 369/44.11, 44.14, 126; 360/324.2; 365/158, 173; 250/306, 307

(56) References Cited

U.S. PATENT DOCUMENTS 5,841,692 A * 11/1998 Gallagher et al. .......... 365/173
5,862,022 A * 1/1999 Noguchi et al. ......... 360/324.2

FOREIGN PATENT DOCUMENTS

| JP | 09-199768 | 7/1997 |
|----|-----------|--------|
| JP | 09-275233 | 10/1997 |
| JP | 10-4012 | 1/1998 |
| JP | 11-54814 | 2/1999 |
| JP | 11-163436 | 6/1999 |

* cited by examiner

*Primary Examiner*—Muhammad Edun
(74) *Attorney, Agent, or Firm*—Sonnenschein, Nath & Rosenthal

(57) ABSTRACT

First and second magnetic layers are laminated though a tunnel barrier layer, wherein a region is formed in which change in a magnetic resistance ratio with respect to change in a voltage applied in such a manner that the second magnetic layer has a lower potential as compared with the potential of the first magnetic layer is smaller than change in a magnetic resistance ratio with respect to change in a voltage applied in such a manner that the second magnetic layer has a higher potential as compared with the potential of the first magnetic layer. Voltage is applied to the magnetic tunnel device in such a manner that the potential of the second magnetic layer is lower than that of the first magnetic layer so that dependency of the magnetic resistance ratio on the voltage is reduced. Thus, a stable tunnel current flows.

19 Claims, 4 Drawing Sheets

MAGNETIC TUNNEL DEVICE, METHOD OF MANUFACTURE THEREOF, AND MAGNETIC HEAD

TECHNICAL FIELD

The present invention relates to a magnetic tunnel device incorporating a pair of magnetic layers laminated through a tunnel barrier layer to pass a tunnel current from either of the magnetic layers to another magnetic layer and structured such that the conductance of the tunnel current varies depending on a polarizability of magnetization of the pair of the magnetic layers, a manufacturing method therefor and a magnetic head.

BACKGROUND ART

Hitherto, a magnetic tunneling effect has been reported which can be obtained from a layer structure in which a thin insulating layer is held between a pair of magnetic metal layers. In this case, the conductance of a tunnel current which flows in the insulating layer varies depending on the relative angle of the pair of the magnetic metal layers. That is, the layer structure in which the thin insulating layer is held between the pair of the magnetic metal layers has a magnetic resistance effect with respect to the tunnel current which flows in the insulating layer.

The magnetic tunneling effect enables a magnetic resistance ratio to theoretically be calculated from the polarizability of magnetization of the pair of the magnetic metal layers. When Fe is employed as the material of the pair of the magnetic metal layers, a magnetic resistance ratio of about 40% can be expected.

Therefore, the magnetic tunnel device having at least the layer structure in which the thin insulating layer is held by the pair of the magnetic metal layers has attracted attention as a device for detecting an external magnetic field.

A magnetic tunnel device of the foregoing type usually has a structure that metal oxide is employed to constitute the thin insulating layer. If the metal oxide is employed to constitute the insulating layer, a pinhole or the like is, however, formed. In this case, short circuit undesirably occurs between the magnetic metal layers forming the pair. When the metal oxide is employed to constitute the insulating layer, a satisfactory degree of oxidation cannot sometimes be obtained. The tunnel barrier becomes too incomplete to always realize the magnetic tunneling effect.

DISCLOSURE OF THE INVENTION

In view of the foregoing, an object of the present invention is to provide a magnetic tunnel device with which a tunnel current can reliably be introduced into a tunnel barrier layer to exhibit a stable magnetic tunnel effect, a manufacturing method therefor and a magnetic head.

A magnetic tunnel device according to the present invention comprises: first and second magnetic layers laminated though a tunnel barrier layer, wherein the magnetic tunnel device has a region in which change in a magnetic resistance ratio with respect to change in a voltage applied in such a manner that the second magnetic layer has a lower potential as compared with the potential of the first magnetic layer is smaller than change in a magnetic resistance ratio with respect to change in a voltage applied in such a manner that the second magnetic layer has a higher potential as compared with the potential of the first magnetic layer.

The magnetic tunnel device having the above-mentioned structure and according to the present invention is structured such that the voltage is applied in such a manner that the potential of the second magnetic layer is lower than that of the first magnetic layer. Therefore, electrons flow from the second magnetic layer to the first magnetic layer through the tunnel barrier layer. At this time, the quantity of change in the magnetic resistance ratio in the magnetic tunnel device is reduced as compared with a case in which electrons are allowed to flow in an inverse direction. That is, the voltage is applied in such a manner that the potential of the second magnetic layer is lower than that of the first magnetic layer. Thus, the dependency of the magnetic resistance ratio of the magnetic tunnel device on the voltage is inhibited. Therefore, in the magnetic tunnel device, stable tunnel currents flow to the tunnel barrier layer without any dependency on the level of the voltage.

A magnetic tunnel device according to the present invention comprises: a first magnetic layer; a tunnel barrier layer formed on the first magnetic layer and structured such that the degree of oxidation is raised from the first magnetic layer; and a second magnetic layer formed on the tunnel barrier layer, wherein electrons are supplied from the second magnetic layer to the first magnetic layer so that tunnel currents are supplied to the tunnel barrier layer.

The magnetic tunnel device structured as described above and according to the present invention is arranged such that metal is oxidized in stages on the first magnetic layer so that the tunnel barrier layer is formed. That is, the tunnel barrier layer having a lowest degree of oxidation is formed on the first magnetic layer. Therefore, the tunnel barrier layer has a satisfactory adhesiveness with respect to the first magnetic layer. Moreover, the magnetic tunnel device is structured such that a direction in which electrons are supplied to the tunnel barrier layer is determined. Therefore, in the magnetic tunnel device, stable tunnel currents are supplied to the tunnel barrier layer without any dependency on the voltage.

A method of manufacturing a magnetic tunnel device according to the present invention comprises the steps of: forming a first magnetic layer; forming a tunnel barrier layer on the first magnetic layer by oxidizing metal in stages; and forming a second magnetic layer on the first magnetic layer through the tunnel barrier layer.

The method of manufacturing a magnetic tunnel device structured as described above and according to the present invention is arranged such that the tunnel barrier layer is formed by oxidizing metal in stages. Therefore, the adhesiveness of the tunnel barrier layer with respect to the first magnetic layer can be improved. Since the foregoing method is structured such that metal is oxidized in stages to form the tunnel barrier layer, a magnetic tunnel device can be manufactured in which tunnel currents are stably flow without any dependency on the voltage.

A magnetic head according to the present invention comprises: a magnetic tunnel device incorporating first and second magnetic layers laminated though a tunnel barrier layer, wherein the magnetic tunnel device has a region in which change in a magnetic resistance ratio with respect to change in a voltage applied in such a manner that the second magnetic layer has a lower potential as compared with the potential of the first magnetic layer is smaller than change in a magnetic resistance ratio with respect to change in a voltage applied in such a manner that the second magnetic layer has a higher potential as compared with the potential of the first magnetic layer, and the magnetic tunnel device serves as a sensitive portion.

The magnetic bead having the above-mentioned structure and according to the present invention is structured such that the voltage is applied to the magnetic tunnel device in such a manner that the potential of the second magnetic layer is lower than that of the first magnetic layer. Therefore, electrons flow from the second magnetic layer to the first magnetic layer through the tunnel barrier layer. At this time, the quantity of change in the magnetic resistance ratio in the magnetic tunnel device is reduced as compared with a case in which electrons are allowed to flow in an inverse direction. That is, the voltage is applied in such a manner that the potential of the second magnetic layer is lower than that of the first magnetic layer. Thus, the dependency of the magnetic resistance ratio of the magnetic tunnel device on the voltage is inhibited. Therefore, in the magnetic head, the magnetic tunnel device serving as the sensitive portion can stably be operated.

A magnetic head according to the present invention comprises: a magnetic tunnel device incorporating a first magnetic layer; a tunnel barrier layer which is formed on the first magnetic layer and in which the degree of oxidation is raised from the first magnetic layer; and a second magnetic layer formed on the tunnel barrier layer, wherein electrons are supplied from the second magnetic layer to the first magnetic layer to cause tunnel currents to flow to the tunnel barrier layer, and the magnetic tunnel device serves as a sensitive portion.

The magnetic head structured as described above and according to the present invention is arranged such that the magnetic tunnel device having the tunnel barrier layer formed on the first magnetic layer by oxidizing metal in stages serves as the sensitive portion. That is, the tunnel barrier layer having a lowest degree of oxidation is formed on the first magnetic layer. Therefore, the tunnel barrier layer has a satisfactory adhesiveness with respect to the first magnetic layer. Moreover, the magnetic head is structured such that a direction in which electrons are supplied to the tunnel barrier layer is determined. Therefore, in the magnetic heads, stable tunnel currents are supplied to the tunnel barrier layer without any dependency on the voltage. As a result, the magnetic tunnel device serving as the sensitive portion can stably be operated.

BEST MODE FOR CARRYING OUT THE INVENTION

Embodiments of a magnetic tunnel device according to the present invention and a manufacturing method therefor will now be described with reference to the drawings.

Figure 1:
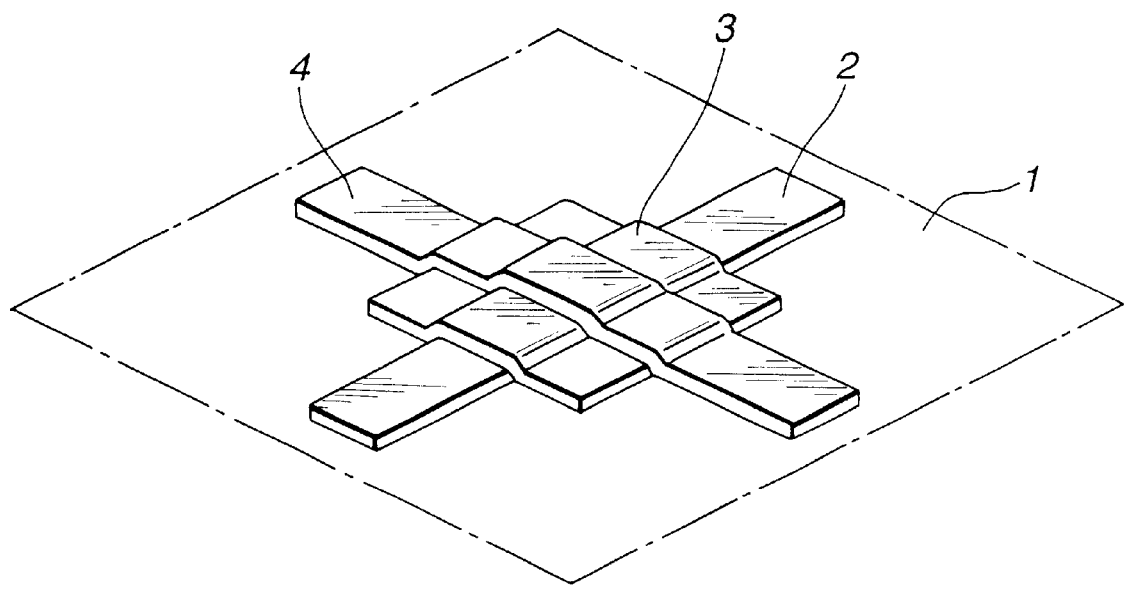
FIG. 1 is a perspective view showing an example of an essential portion of a magnetic tunnel device.

As shown in FIG. 1, the magnetic tunnel device according to this embodiment incorporates an elongated first magnetic metal layer 2 formed on a non-magnetic substrate 1; a tunnel barrier layer 3 formed to cover the central portion of the first magnetic metal layer 2; and a second magnetic metal layer 4. The lengthwise directions of the first magnetic metal layer 2 and the second magnetic metal layer 4 of the magnetic tunnel device according to the present invention are made to be substantially perpendicular to each other. The first magnetic metal layer 2 and the second magnetic metal layer 4 of the foregoing magnetic tunnel device are laminated through the tunnel barrier layer 3 at their central portions.

Figure 2:
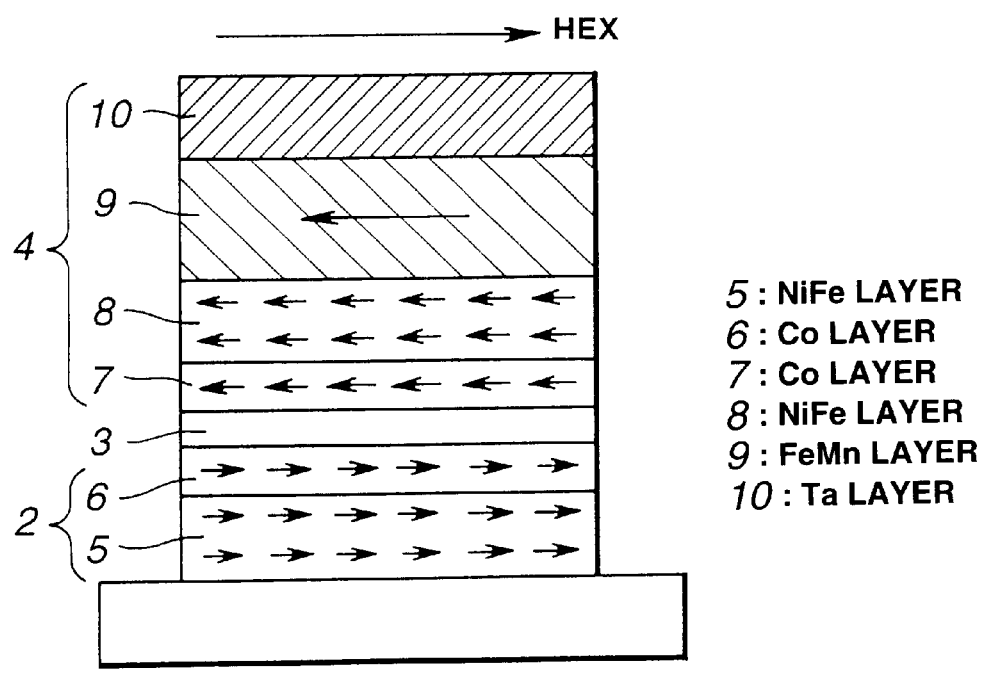
FIG. 2 is a cross sectional view showing an essential portion of the magnetic tunnel device.

FIG. 2 is a cross sectional view showing a portion of the magnetic tunnel device in which the first magnetic metal layer 2 and the second magnetic metal layer 4 are laminated through the tunnel barrier layer 3. As shown in FIG. 2, the first magnetic metal layer 2 is formed into a double-layer structure constituted by sequentially laminating a NiFe layer 5 and a Co layer 6 on the non-magnetic substrate 1. The second magnetic metal layer 4 is formed into a quadruple-layer structure constituted by sequentially laminating a Co layer 7, a NiFe layer 8, a FeMn layer 9 and a Ta layer 10 on the tunnel barrier layer 3.

Specifically, the non-magnetic substrate 1 was a (100%) Si substrate having a surface oxidized by a thickness of 3000 angstroms.

The NiFe layer 5 of the first magnetic metal layer 2 is a magnetization-free film which has small coercive force and the magnetization direction of which varies according to an external magnetic field. The Co layer 6 of the first magnetic metal layer 2 is a layer for raising a spin polarizability in cooperation with the Co layer 7 to be described later. That is, the Co layer 6 and the Co layer 7 are disposed in the interface between the NiFe layer 5 and the tunnel barrier layer 3 and between the NiFe layer 8 and the tunnel barrier layer 3 so that the magnetic resistance ratio of the magnetic tunnel device is raised.

Specifically, the NiFe layer 5 having a thickness of 188 angstroms is formed on the non-magnetic substrate 1. The Co layer 6 having a thickness of 33 angstroms is formed on the NiFe layer 5. The NiFe layer 5 and the Co layer 6 were formed into elongated shapes by a sputtering process using a metal mask.

The first magnetic metal layer 2 is subjected to a so-called annealing process. The annealing process was performed in a vacuum of $6 \times 10^4$ Pa at 350° C. while a magnetic field of 330 Oe was being applied in the lengthwise direction of the first magnetic metal film.

The tunnel barrier layer 3 is a layer having a degree of oxidation which is raised in a direction apart from the first magnetic metal layer 2 by oxidizing metal in a stepped manner. The tunnel barrier layer 3 serves an electrical barrier between the first magnetic metal layer 2 and the second magnetic metal layer 4. That is, the tunnel barrier layer 3 serves as a so-called tunnel barrier layer.

The tunnel barrier layer 3 is formed by using a metal material, for example, Al, Gd, Hf, Fe, Co, Ni, Se or Mg. The material of the tunnel barrier layer 3 is not limited to the foregoing metal elements. If the employed material is able to serve as the tunnel barrier layer after the material has been oxidized, any metal may be employed.

When the tunnel barrier layer 3 is formed, a film composed of the metal element is formed on the first magnetic metal layer 2 such that the partial pressure of oxygen is raised. Since the partial pressure of oxygen is raised, the degree of oxidation of the tunnel barrier layer 3 is raised in a direction apart from the first magnetic metal layer 2. Specifically, the tunnel barrier layer 3 is formed with a processing gas which is a mixed gas of Ar and $O_2$ in a process performed for 60 seconds. When the film forming process is started, the partial pressure ratio in the mixed gas was made such that $Ar:O_2=10:0$. To make the partial pressure ratio to be $Ar:O_2=10:1$ after a lapse of 60 seconds, the partial pressure of oxygen was raised in a direct proportional manner.

The foregoing method was performed such that the partial pressure of oxygen was raised in the direct proportional manner to oxide the metal in the stepped manner so that the tunnel barrier layer 3 was formed. The present invention is not limited to the foregoing method. That is, the partial pressure of oxygen may be raised exponentially.

The FeMn layer 9 of the second magnetic metal layer 4 is made of an antiferromagnetic material which fixes the magnetization of the NiFe layer 8 to a predetermined direction. The FeMn layer 9 causes the NiFe layer 8 to be a fixed-magnetization film. In the second magnetic metal layer 4, the Co layer 7 is the layer for improving the magnetic resistance ratio of the magnetic tunnel device, as described above. In the second magnetic metal layer 4, the Ta layer 10 is a layer for preventing corrosion of the FeMn layer 9.

Specifically, sputtering using a metal mask was performed in such a manner that the thickness of the Co layer 7 was 26 angstrom, that of the NiFe layer 8 was 188 angstrom, that of the FeMn layer 9 was 450 angstrom, that of the Ta layer 10 was 200 angstrom. The foregoing layers were sequentially formed into elongated shapes. At this time, the forming process was performed while a magnetic field of 52 Oe was being applied to each layer in a direction perpendicular to the lengthwise direction.

The process gas for sputtering each layer was Ar gas. The pressure of the Ar gas for forming each layer was 0.3 Pa for forming the NiFe films 5 and 8 and the Co films 6 and 7. The pressure for forming Al was 0.2 Pa and that for forming the FeMn layer 9 was 0.6 Pa.

Specifically, the area in which the first magnetic metal layer 2 and the second magnetic metal layer 4 overlap, that is, the area in which the tunnel current flows was varied to 9 types consisting of $100\times100$ $\mu m^2$ to $500\times500$ $\mu m^2$.

When an external magnetic field is applied to the magnetic tunnel device structured as described above, the direction of magnetization of the NiFe film 5 of the first magnetic metal layer 2 is changed. On the other hand, the direction of magnetization of the second magnetic metal layer 4 is not changed even if an external magnetic field is applied. Therefore, when an external magnetic field is applied to the magnetic tunnel device, the relative angle between the direction of magnetization of the NiFe film 5 and that of the NiFe layer 8 is changed.

When the relative angle between the direction of magnetization of the NiFe film 5 and that of the NiFe layer 8 is changed, resistance with respect to a tunnel current which flows in the tunnel barrier layer 3 is changed. Namely, the resistance with respect to the tunnel current which flows in the tunnel barrier layer 3 varies depending on the relative angle between the direction of magnetization of the NiFe film 5 and that of the NiFe layer 8. Therefore, when a predetermined tunnel current is supplied to the tunnel barrier layer 3 of the magnetic tunnel device and the level of the voltage of the tunnel current is detected, change in the resistance with respect to the tunnel current can be detected as change in the voltage. That is, the external magnetic field for the tunnel device can be detected by detecting change in the voltage of the tunnel current.

In particular, the magnetic tunnel device according to the present invention is structured such that the quantity of change in the magnetic resistance ratio with respect to the change in the voltage is different between the following two cases: a case in which the voltage is applied in such a manner that the potential of the second magnetic metal layer 4 is lower than that of the first magnetic metal layer 2; and a case in which the potential of the second magnetic metal layer 4 is higher than that of the first magnetic metal layer 2. In the following description, the voltage applied in such a manner that the potential of the second magnetic metal layer 4 is lower than that of the first magnetic metal layer 2 is called "positive voltage" and the voltage applied in such a manner that the potential of the second magnetic metal layer 4 is higher than that of the first magnetic metal layer 2 is called "negative voltage".

Figure 3:
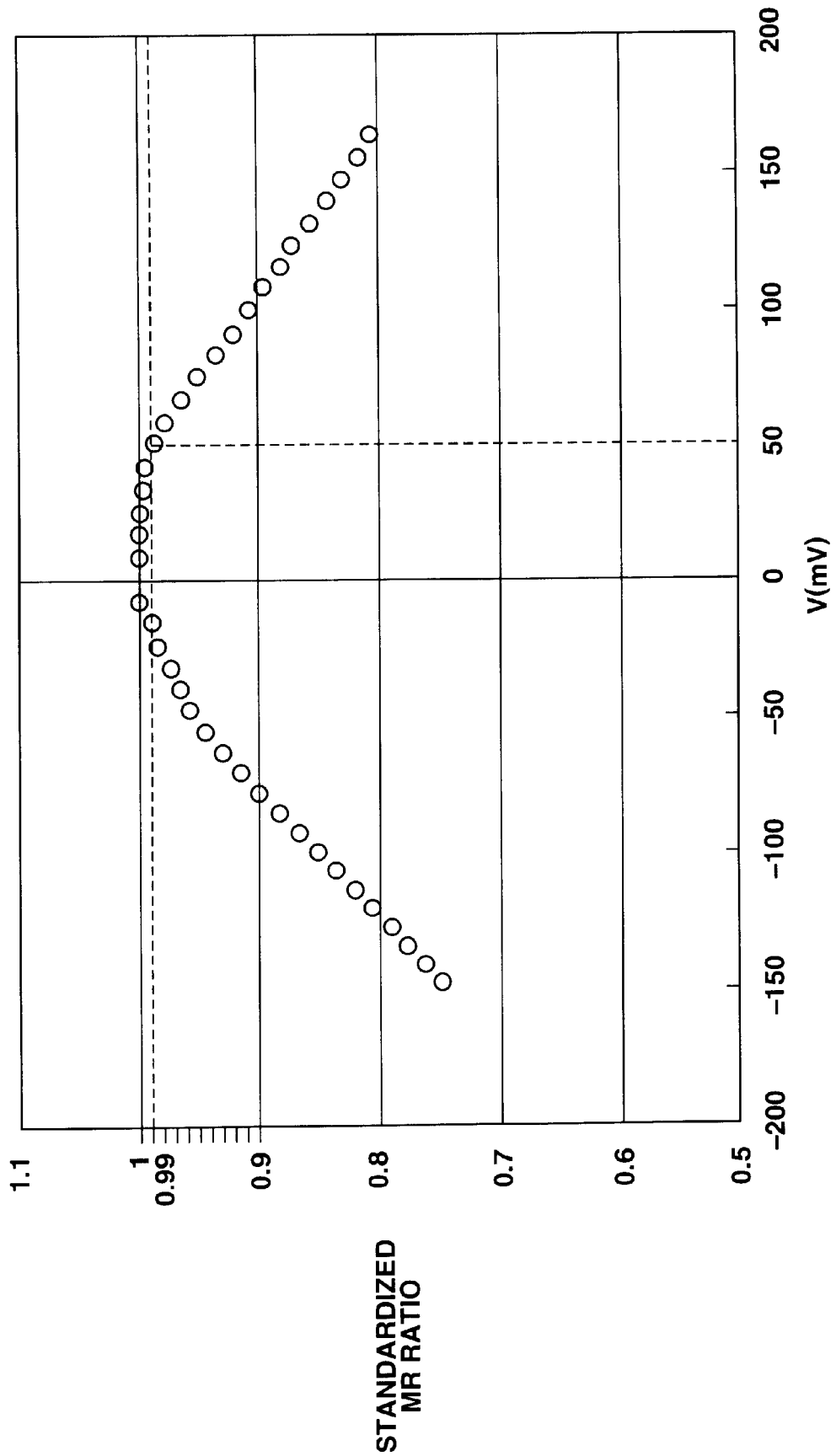
FIG. 3 is a graph showing the relationship between voltages in the magnetic tunnel device and standardized magnetic resistance ratios.

As shown in FIG. 3, the magnetic tunnel device has a region in which the quantity of the change in the magnetic resistance ratio with respect to the change in the positive voltage is smaller than the quantity of change in the magnetic resistance ratio with respect to the change in the negative voltage. Namely, the magnetic tunnel device has a region in which the magnetic resistance ratio is substantially constant without any dependency on the change in the voltage when the positive voltage has been applied.

The axis of ordinate of FIG. 3 stands for values (called "standardized MR ratios") obtained by dividing a maximum magnetic resistance ratio with a magnetic resistance ratio at a predetermined voltage level. The axis of abscissa stands for the levels of voltage (the positive voltage is indicated with a plus value and the negative voltage is indicated with a minus value) which is applied to the magnetic tunnel device.

The magnetic tunnel device according to the present invention is operated in a region in which the magnetic resistance ratio is substantially constant without any dependency on the change in the voltage. Therefore, a stable magnetic tunneling effect can be obtained. That is, the magnetic tunnel device has substantially a constant magnetic resistance ratio regardless of the change in the voltage when electrons are supplied from the second magnetic metal layer 4 to the first magnetic metal layer 2. Therefore, a stable operation can be performed. Specifically, when positive voltage of 0 mV to 50 mV is applied, the change in the magnetic resistance ratio of the magnetic tunnel device can be reduced to 1% or lower as can be understood from FIG. 3. Therefore, when the magnetic tunnel device is oxidized with the positive voltage of 0 mV to 50 mV, a stable operation is permitted.

It is preferable for the magnetic tunnel device according to the present invention, the change in the magnetic resistance ratio in at least a range of the positive voltage from 0 mV to 1.25 mV is 1% or lower. Namely, it is preferable that the maximum value of the positive voltage with which the change of the magnetic resistance ratio is made to be 1% or lower is 1.25 mV or higher.

In a case of the magnetic tunnel device incorporating Fe and having a magnetic resistance ratio of about 40%, the operating voltage must be 1.25 mV to obtain an output of change in the voltage of 0.5 mV. Namely, when the maximum value of the positive voltage with which the change in the magnetic resistance ratio is 1% or lower is lower than 1.25 mV, there is apprehension that a sufficiently large output of the change in the voltage cannot be obtained by using the foregoing magnetic tunnel device having a magnetic resistance ratio of about 40%.

It is preferable that the magnetic tunnel device according to the present invention is employed as, for example, a magnetic head for reproducing a signal recorded on a magnetic recording medium. Namely, it is preferable that the magnetic head has the structure that a sensitive portion for detecting a magnetic field from the magnetic recording medium comprises the above-mentioned magnetic tunnel device.

When the positive voltage is applied to the magnetic tunnel device, the foregoing magnetic head is able to stably detect a magnetic field from the magnetic recording medium.

The magnetic tunnel device has a high magnetic resistance ratio as compared with a usual anisotropic magnetoresistance device and a giant magnetoresistance device. Therefore, it is preferable that the magnetic tunnel device according to the present invention is employed as a magnetic head adaptable to a high-density-recording magnetic recording medium. Namely, the magnetic head incorporating the sensitive portion which comprises the magnetic tunnel device is able to reliably reproduce a magnetic recording medium on which information has been recorded at a high density.

The foregoing magnetic tunnel device has the structure that the magnetic resistance ratio is made to be substantially constant without any dependency on the change in the voltage by applying the positive voltage. The reason for this lies in that the magnetic tunnel device is structured such that the tunnel barrier layer 3 is formed such that the degree of oxidation is raised from the first magnetic metal layer 2 by oxidizing metal in stages.

When the positive voltage is applied to the tunnel barrier layer 3 as described above, electrons are supplied from a portion having a high degree of oxidation. Namely, when electrons are supplied from the second magnetic metal layer 4 having a high degree of oxidation, the magnetic tunnel device according to the present invention has a stable magnetic tunneling effect.

Figure 4:
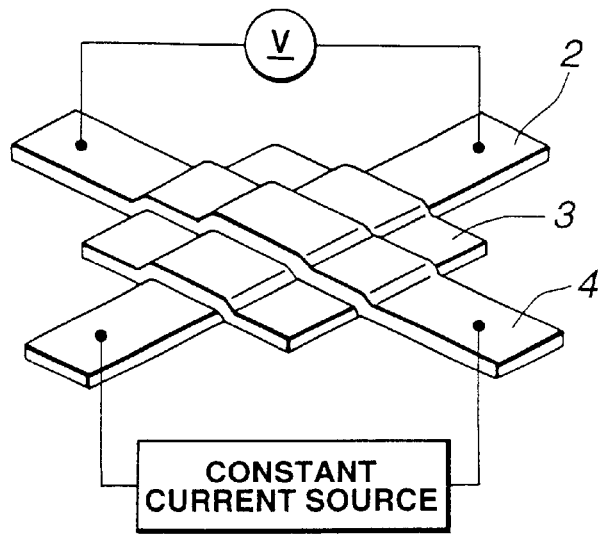
FIG. 4 is a perspective view showing an essential portion of the magnetic tunnel device to which a constant-current source and a voltmeter are connected.

The foregoing effect was confirmed by using a structure in which a constant-current source for supplying a predetermined electric current and a voltmeter for measuring the voltage between the first magnetic metal layer 2 and the second magnetic metal layer 4 are connected to the foregoing magnetic tunnel device, as shown in FIG. 4. Thus, the resistance and the magnetic resistance ratio were measured such that the direction in which electrons were supplied was changed.

A direction in which electrons were supplied from the first magnetic metal layer 2 to the second magnetic metal layer 4 was called a "−direction". A converse direction in which electrons were supplied from the second magnetic metal layer 4 to the first magnetic metal layer 2 was called a "+direction". The voltmeter was connected in such a manner that a minus value was read when electrons were supplied in the "−direction" and a plus value was read when electrons were supplied in the "+direction".

An external magnetic field formed in a predetermined direction was applied to the above-mentioned magnetic tunnel device to change the voltage so as to measure the resistance and the change in the magnetic resistance ratio. Results were shown in FIG. 5.

Figure 5:
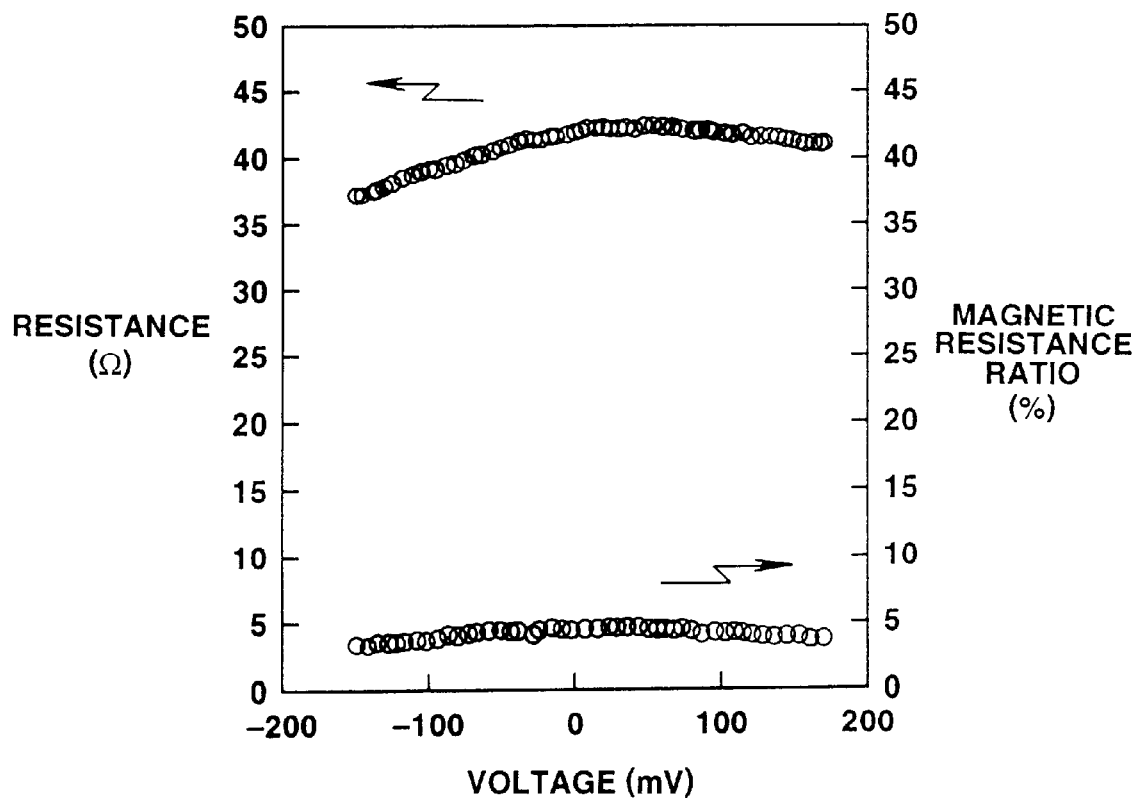
FIG. 5 is a graph showing voltages which are applied to the magnetic tunnel device, resistance and magnetic resistance ratios.

As can be understood from FIG. 5, when electrons were supplied in the −direction, the resistance was changed as the applied voltage was raised. Namely, when electrons were supplied in the −direction, the resistance of the tunnel barrier layer 3 had dependency on the voltage such that the resistance was undesirably changed according to the voltage level.

When electrons were supplied in the +direction, the resistance was substantially constant if the applied voltage was raised. The foregoing fact was shown that the tunnel barrier layer 3 had not dependency on the voltage when electrons were supplied in the +direction. As shown in FIG. 5, the magnetic resistance ratio was constant because the external magnetic field formed in the predetermined direction was applied. Note that FIG. 3 was made by using the values of the magnetic resistance ratios shown in FIG. 5.

Figure 6:
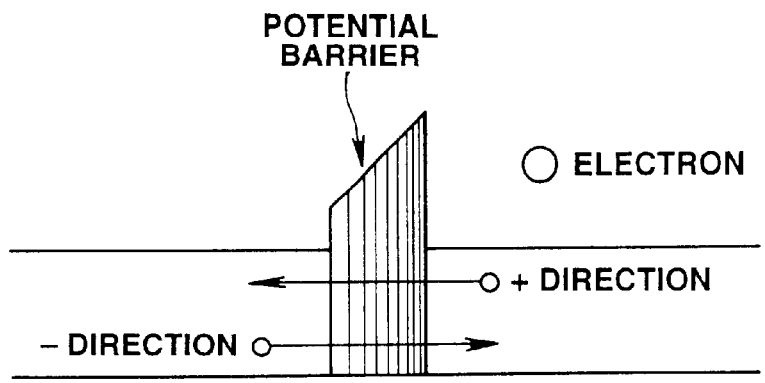
FIG. 6 is a schematic view showing a tunnel barrier in the magnetic tunnel device.

Therefore, a fact was confirmed that the magnetic tunnel device having the tunnel barrier layer 3 in which the degree of oxidation was raised from the first magnetic metal layer 2 had a stale magnetic tunnel effect without any dependency on the voltage when electrons were supplied in the +direction. The reason for this was considered that the portion of the tunnel barrier layer 3 adjacent to the second magnetic metal layer 4 was most intensely oxidized and, therefore, the potential of the tunnel barrier in the direction of the thickness of the tunnel barrier layer 3 was as shown in FIG. 6.

The foregoing magnetic tunnel device incorporates the tunnel barrier layer 3 by gradually raising the partial pressure of oxygen. Therefore, the tunnel barrier layer 3 of the magnetic tunnel device has satisfactory adhesiveness with respect to the first magnetic metal layer 2. Hence it follows that the magnetic tunnel device is able to reliably prevent separation of the tunnel barrier layer 3 from the first magnetic metal layer 2 and short circuit between the first magnetic metal layer 2 and the second magnetic metal layer 4 through a pinhole. As a result, tunnel currents can stably flow in the foregoing magnetic tunnel device.

The foregoing magnetic tunnel device is subjected to the annealing process as described above. The annealing process is performed under temperature and magnetic field conditions determined in consideration of the magnetic resistance ratio, the soft magnetic characteristic or magnetic stability. Therefore, the magnetic tunnel device subjected to the foregoing annealing process has a required magnetic resistance ratio and a soft magnetic characteristic.

Figure 7:
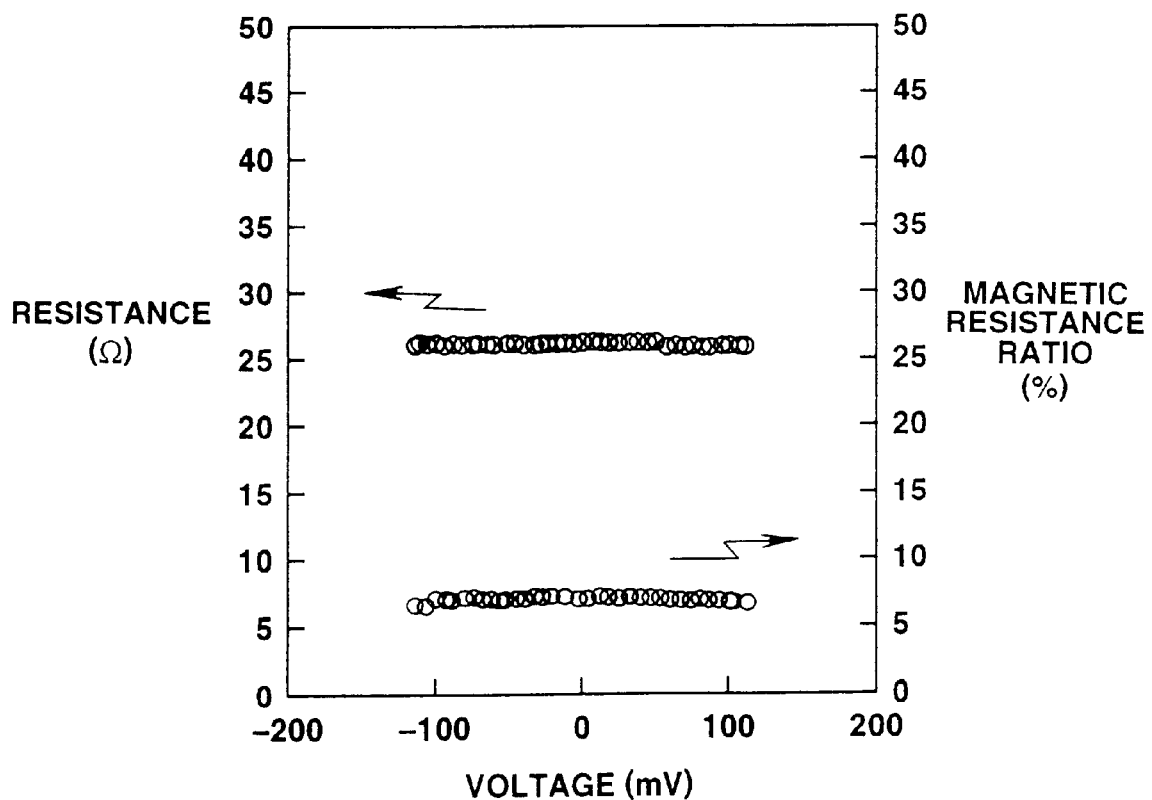
FIG. 7 is a graph showing voltages which are applied to the magnetic tunnel device formed without an annealing process, resistance and magnetic resistance ratios.

A magnetic tunnel device of a type which is not subjected to the annealing process encounters change in the resistance and change in the magnetic resistance ratio when the voltage is changed in a slate in which an external magnetic field formed in a predetermined direction is being applied, as shown in FIG. 7. As shown in FIG. 7, when the annealing process is not performed, any dependency on the voltage is not exhibited if electrons are supplied in either of the +direction or the −direction.

Therefore, a fact can be understood that supply of electrons from the second magnetic metal layer 4 to the first magnetic metal layer 2 of the magnetic tunnel device subjected to the annealing process is an effective process.

The foregoing magnetic tunnel device has substantially a constant magnetic resistance ratio without any dependency on the voltage when the positive voltage is applied. Note that the present invention is not limited to the foregoing structure. For example, the present invention may be applied to a magnetic tunnel device of a type having a region in which the quantity of change in the magnetic resistance ratio with respect to change in negative voltage is smaller than the quantity of change in the magnetic resistance ratio with respect to change in the positive voltage. That is, in the foregoing case, the negative voltage is applied to the magnetic tunnel device to supply electrons from the first magnetic metal layer 2 to the second magnetic metal layer 4. Thus, substantially a constant magnetic resistance ratio is exhibited without any dependency on the change in the voltage. Therefore, when the negative voltage is applied, the foregoing magnetic tunnel device exhibits the stable magnetic tunnel effect.

Industrial Applicability

As described above, the magnetic tunnel device according to the present invention is structured such that voltage is applied in such a manner that the potential of the second magnetic layer is lower than that of the first magnetic layer so that the dependency of the magnetic resistance ratio on the voltage is restrained. As a result, a stable tunnel current flows in the tunnel barrier layer of the magnetic tunnel device without any dependency on the voltage level. Therefore, a stable magnetic tunnel effect can always be exhibited.

The magnetic tunnel device according to the present invention incorporates the tunnel barrier layer which is formed on the first magnetic layer and in which the degree of oxidation is raised from the first magnetic layer, wherein electrons are supplied from the second magnetic layer to the first magnetic layer. Therefore, the magnetic tunnel device is able to exhibit a stable magnetic tunnel effect without any dependency on the level of the applied voltage. The foregoing magnetic tunnel device has the structure that the surface of the insulating layer allowed to adhere to the first magnetic layer has the lowest degree of oxidation. Therefore, satisfactory adhesiveness is realized between the first magnetic layer and the insulating layer. Thus, the magnetic tunnel device according to the present invention is able to always exhibit a stable magnetic tunnel effect.

The method of manufacturing the magnetic tunnel device according to the present invention has the step of oxidizing metal in stages to form the tunnel barrier layer. Therefore, the adhesiveness of the tunnel barrier layer with the surface of the first magnetic layer can be improved. Moreover, the foregoing method has the step of oxidizing metal in stages to form the tunnel barrier layer. Hence it follows that the magnetic tunnel device in which the tunnel current stably flows without any dependency on the level of the voltage can be manufactured. Therefore, the foregoing method is able to reliably manufacture the magnetic tunnel device which always exhibits a stable magnetic tunnel effect.

The magnetic head according to the present invention is arranged such that voltage is applied to the magnetic tunnel device in such a manner that the potential of the second magnetic layer is lower than that of the first magnetic layer. Therefore, the dependency of the magnetic resistance ratio of the magnetic tunnel device on the voltage can be reduced. Therefore, the magnetic tunnel device which is the sensitive portion of the magnetic head is able to stably operate. Therefore, a stable electromagnetic conversion characteristic can be exhibited.

What is claimed is:

1. A magnetic tunnel device comprising:
    first and second magnetic layers laminated though a tunnel layer, said tunnel layer having stepped oxidation which is raised in a direction apart from said first magnetic layer, wherein
        said magnetic tunnel device has a region in which change in a magnetic resistance ratio with respect to change in a voltage applied in such a manner that said second magnetic layer has a lower potential as compared with the potential of said first magnetic layer is smaller than change in a magnetic resistance ratio with respect to change in a voltage applied in such a manner that said second magnetic layer has a higher potential as compared with the potential of said first magnetic layer.

2. A magnetic tunnel device according to claim 1, wherein a highest level of the voltage with which change in the magnetic resistance ratio is made to be 1% or lower and which is applied in such a manner that the potential of said second magnetic layer is lower than the potential of said first magnetic layer is 1.25 mV or higher.

3. A magnetic tunnel device according to claim 1, wherein said first magnetic layer incorporates at least a magnetization-free film in which a direction of magnetization is changed according to an external magnetic field, and said second magnetic layer incorporates at least a magnetization-fixed layer magnetized fixedly in a predetermined direction.

4. A magnetic tunnel device according to claim 1, wherein said first magnetic layer incorporates at least a magnetization-fixed layer magnetized fixedly in a predetermined direction, and said second magnetic layer incorporates at least a magnetization-free film in which a direction of magnetization is changed according to an external magnetic field.

5. A magnetic tunnel device according to claim 1, wherein said magnetic tunnel device is subjected to an annealing process at 200° C. to 350° C.

6. A magnetic tunnel device comprising:
    a first magnetic layer;
    a tunnel barrier layer formed on said first magnetic layer and structured such that the degree of oxidation is raised in a direction apart from said first magnetic layer; and
    a second magnetic layer formed on said tunnel barrier layer, wherein
        electrons are supplied from said second magnetic layer to said first magnetic layer so that tunnel currents are supplied to said tunnel barrier layer.

7. A magnetic tunnel device according to claim 6, wherein said first magnetic layer incorporates at least a magnetization-free film in which a direction of magnetization is changed according to an external magnetic field, and said second magnetic layer incorporates at least a magnetization-fixed layer magnetized fixedly in a predetermined direction.

8. A magnetic tunnel device according to claim 6, wherein said first magnetic layer incorporates at least a magnetization-fixed layer magnetized fixedly in a predetermined direction, and said second magnetic layer incorporates at least a magnetization-free film in which a direction of magnetization is changed according to an external magnetic field.

9. A magnetic tunnel device according to claim 6, wherein said magnetic tunnel device is subjected to an annealing process at 200° C. to 350° C.

10. A method of manufacturing a magnetic tunnel device comprising the steps of:
    forming a first magnetic layer;
    forming a tunnel barrier layer on said first magnetic layer by oxidizing, in a direction apart from said first magnetic layer, said tunnel barrier layer in stages; and
    forming a second magnetic layer on said first magnetic layer through said tunnel barrier layer.

11. A magnetic head comprising:
    a magnetic tunnel device incorporating first and second magnetic layers laminated though a tunnel barrier layer, said tunnel layer having stepped oxidation which is raised in a direction apart from said first magnetic layer, wherein said magnetic tunnel device has a region in which change in a magnetic resistance ratio with respect to change in a voltage applied in such a manner that said second magnetic layer has a lower potential as compared with the potential of said first magnetic layer is smaller than change in a magnetic resistance ratio with respect to change in a voltage applied in such a manner that said second magnetic layer has a higher potential as compared with the potential of said first magnetic layer, and said magnetic tunnel device serves as a sensitive portion.

12. A magnetic head according to claim 11, wherein a highest level of the voltage with which change in the magnetic resistance ratio is made to be 1% or lower and which is applied in such a manner that the potential of said second magnetic layer is lower than the potential of said first magnetic layer is 1.25 mV or higher.

13. A magnetic head according to claim 11, wherein said first magnetic layer incorporates at least a magnetization-free film in which a direction of magnetization is changed according to an external magnetic field, and said second magnetic layer incorporates at least a magnetization-fixed layer magnetized fixedly in a predetermined direction.

14. A magnetic bead according to claim 11, wherein said first magnetic layer incorporates at least a magnetization-fixed layer magnetized fixedly in a predetermined direction, and said second magnetic layer incorporates at least a magnetization-free film in which a direction of magnetization is changed according to an external magnetic field.

15. A magnetic head according to claim 11, wherein said magnetic head is subjected to an annealing process at 200° C. to 350° C.

16. A magnetic head comprising:

a magnetic tunnel device incorporating a first magnetic layer;

a tunnel barrier layer which is formed on said first magnetic layer and in which the degree of oxidation is raised in a direction apart from said first magnetic layer; and a second magnetic layer formed on said tunnel barrier layer, wherein electrons are supplied from said second magnetic layer to said first magnetic layer to cause tunnel currents to flow to said tunnel barrier layer, and said magnetic tunnel device serves as a sensitive portion.

17. A magnetic bead according to claim 16, wherein said first magnetic layer incorporates at least a magnetization-free film in which a direction of magnetization is changed according to an external magnetic field, and said second magnetic layer incorporates at least a magnetization-fixed layer magnetized fixedly in a predetermined direction.

18. A magnetic bead according to claim 16, wherein said first magnetic layer incorporates at least a magnetization-fixed layer magnetized fixedly in a predetermined direction, and said second magnetic layer incorporates at least a magnetization-free film in which a direction of magnetization is changed according to an external magnetic field.

19. A magnetic bead according to claim 16, wherein said magnetic bead is subjected to an annealing process at 200° C. to 350° C.

* * * * *